US008948228B2

(12) United States Patent
Adler

(10) Patent No.: US 8,948,228 B2
(45) Date of Patent: Feb. 3, 2015

(54) METHODS, SYSTEMS, AND DEVICES FOR TIMING CONTROL IN ELECTROMAGNETIC RADIATION SOURCES

(71) Applicant: Desmond Adler, Melrose, MA (US)

(72) Inventor: Desmond Adler, Melrose, MA (US)

(73) Assignee: LightLab Imaging, Inc., Westford, MA (US)

( * ) Notice: Subject to any disclaimer, the term of this patent is extended or adjusted under 35 U.S.C. 154(b) by 0 days.

(21) Appl. No.: 14/048,308

(22) Filed: Oct. 8, 2013

(65) Prior Publication Data
US 2014/0036941 A1 Feb. 6, 2014

Related U.S. Application Data

(62) Division of application No. 13/048,441, filed on Mar. 15, 2011, now Pat. No. 8,582,619.

(51) Int. Cl.
H01S 3/08 (2006.01)
H01S 3/106 (2006.01)
H01S 3/11 (2006.01)
G01B 9/02 (2006.01)
H01S 3/067 (2006.01)
H01S 3/083 (2006.01)
(Continued)

(52) U.S. Cl.
CPC ........... H01S 3/1062 (2013.01); H01S 3/08013 (2013.01); H01S 3/08059 (2013.01); H01S 3/1109 (2013.01); G01B 9/02004 (2013.01); G01B 9/02091 (2013.01); G01B 9/02069 (2013.01); H01S 3/06791 (2013.01); H01S 3/083 (2013.01); H01S 5/1071 (2013.01); H01S 5/146 (2013.01)

USPC ............... 372/102; 372/106; 372/98; 372/20; 372/18

(58) Field of Classification Search
USPC ................. 372/102, 106, 98, 20, 18
See application file for complete search history.

(56) References Cited

U.S. PATENT DOCUMENTS 5,140,599 A * 8/1992 Trutna et al. .................... 372/20
5,263,037 A 11/1993 Trutna, Jr. et al.
5,321,501 A 6/1994 Swanson et al.
(Continued)

FOREIGN PATENT DOCUMENTS

EP 0 524 382 1/1993
WO 03096106 11/2003

OTHER PUBLICATIONS

Aljada et al., "Experimental demonstration of a tunable laser using an SOA and an Opto-VLSI Processor," Optic Express, 15(15):9666-9671, Jul. 23, 2007.
(Continued)

Primary Examiner — Kinam Park
(74) Attorney, Agent, or Firm — K&L Gates LLP

(57) ABSTRACT

In one embodiment, the invention relates to systems, methods and devices for improving the operation of an electromagnetic radiation source or component thereof. In one embodiment, the source is a laser source. A Fourier domain mode locked laser can be used in various embodiments. The sources described herein can be used in an optical coherence tomography (OCT) system such as a frequency domain OCT system. In one embodiment, laser coherence length is increased by compensating for dispersion. A frequency shifter can also be used in one embodiment to compensate for a tunable filter induced Doppler shift.

21 Claims, 8 Drawing Sheets

(51) Int. Cl.
*H01S 5/10* (2006.01)
*H01S 5/14* (2006.01)

(56) References Cited

U.S. PATENT DOCUMENTS

| | | |
|---|---|---|
| 5,459,570 A | 10/1995 | Swanson et al. |
| 5,465,147 A | 11/1995 | Swanson |
| 5,491,577 A | 2/1996 | Gautheron et al. |
| 5,500,762 A | 3/1996 | Uchiyama et al. |
| 5,509,093 A | 4/1996 | Miller et al. |
| 5,574,739 A | 11/1996 | Carruthers et al. |
| 5,619,368 A | 4/1997 | Swanson |
| 5,748,598 A | 5/1998 | Swanson et al. |
| 5,784,352 A | 7/1998 | Swanson et al. |
| 5,956,355 A | 9/1999 | Swanson et al. |
| 5,991,477 A | 11/1999 | Ishikawa et al. |
| 6,111,645 A | 8/2000 | Tearney et al. |
| 6,134,003 A | 10/2000 | Tearney et al. |
| 6,160,826 A | 12/2000 | Swanson et al. |
| 6,191,862 B1 | 2/2001 | Swanson et al. |
| 6,282,011 B1 | 8/2001 | Tearney et al. |
| 6,282,215 B1 | 8/2001 | Zorabedian et al. |
| 6,373,632 B1 | 4/2002 | Flanders et al. |
| 6,421,164 B2 | 7/2002 | Tearney et al. |
| 6,445,939 B1 | 9/2002 | Swanson et al. |
| 6,485,413 B1 | 11/2002 | Boppart et al. |
| 6,501,551 B1 | 12/2002 | Tearney et al. |
| 6,552,796 B2 | 4/2003 | Magnin et al. |
| 6,564,087 B1 | 5/2003 | Pitris et al. |
| 6,570,659 B2 | 5/2003 | Schmitt |
| 6,608,711 B2 | 8/2003 | Flanders et al. |
| 6,706,004 B2 | 3/2004 | Tearney et al. |
| 6,816,515 B1 | 11/2004 | Yun et al. |
| 6,847,662 B2 | 1/2005 | Bouda et al. |
| 6,856,386 B2 | 2/2005 | Anderson et al. |
| 6,879,851 B2 | 4/2005 | McNamara et al. |
| 6,891,984 B2 | 5/2005 | Petersen et al. |
| 6,985,234 B2 | 1/2006 | Anderson |
| 7,061,618 B2 | 6/2006 | Atia et al. |
| 7,061,621 B2 | 6/2006 | Krause |
| 7,075,058 B2 | 7/2006 | Chinn et al. |
| 7,208,333 B2 | 4/2007 | Flanders et al. |
| 7,231,243 B2 | 6/2007 | Tearney et al. |
| 7,241,286 B2 | 7/2007 | Atlas |
| 7,260,126 B2 | 8/2007 | Wang et al. |
| 7,373,089 B2 | 5/2008 | Yu et al. |
| 7,414,779 B2 | 8/2008 | Huber et al. |
| 7,415,049 B2 | 8/2008 | Flanders et al. |
| 7,625,366 B2 | 12/2009 | Atlas |
| 7,813,609 B2 | 10/2010 | Petersen et al. |
| 7,843,976 B2 | 11/2010 | Cable et al. |
| 7,848,791 B2 | 12/2010 | Schmitt et al. |
| 7,884,945 B2 | 2/2011 | Srinivasan et al. |
| 7,894,122 B2 * | 2/2011 | Reynolds ............... 359/291 |
| 7,916,387 B2 | 3/2011 | Schmitt et al. |
| 7,935,060 B2 | 5/2011 | Schmitt et al. |
| 7,936,462 B2 | 5/2011 | Jiang |
| 2002/0054614 A1 | 5/2002 | Jin |
| 2002/0161351 A1 | 10/2002 | Samson et al. |
| 2003/0179790 A1 | 9/2003 | Bouda et al. |
| 2004/0028332 A1 * | 2/2004 | Nishiki ............... 385/37 |
| 2005/0078716 A1 | 4/2005 | Liu |
| 2005/0201662 A1 | 9/2005 | Petersen et al. |
| 2005/0265402 A1 | 12/2005 | Tanaka et al. |
| 2006/0095065 A1 | 5/2006 | Tanimura et al. |
| 2006/0109872 A1 | 5/2006 | Sanders |
| 2006/0187537 A1 | 8/2006 | Huber et al. |
| 2008/0165366 A1 | 7/2008 | Schmitt |
| 2009/0174931 A1 | 7/2009 | Huber et al. |
| 2009/0306520 A1 | 12/2009 | Schmitt et al. |
| 2010/0076320 A1 | 3/2010 | Petersen et al. |
| 2010/0094127 A1 | 4/2010 | Xu |
| 2010/0103964 A1 | 4/2010 | Huber |
| 2010/0253949 A1 | 10/2010 | Adler et al. |
| 2011/0007315 A1 | 1/2011 | Petersen et al. |
| 2011/0051143 A1 | 3/2011 | Flanders et al. |
| 2011/0051148 A1 | 3/2011 | Flanders et al. |
| 2011/0071404 A1 | 3/2011 | Schmitt et al. |
| 2011/0071405 A1 | 3/2011 | Judell et al. |
| 2011/0101207 A1 | 5/2011 | Schmitt |
| 2011/0151980 A1 | 6/2011 | Petroff |

OTHER PUBLICATIONS

Eigenwillig et al., "Wavelength Swept ASE Source," Proceedings of the SPIE—The International Society for Optical Engineering SPIE—The International Society for Optical Engineering USA, vol. 7372, 2009, 6 pgs.

Takada et al., "Loss distribution measurement of silica-based waveguides by using a jaggedness-free optical low coherence reflectometer," Electronics Letters, 30(17):1441-1443, Aug. 18, 1994.

Takada et al., "Tunable Narrow-Band Light Source Using Two Optical Circulators," IEEE Photonics Technology Letters, 9(1):91-93, Jan. 1997.

Huber et al., "Amplified, Frequency Swept Lasers for Frequency Domain Reflectometry and OCT Imaging: Design and Scaling Principles", Optics Express 13:9, May 2, 2005.

Chang T. et al., Pulsed Dye-Laser with Grating and Etalon in a Symmetric Arrangement. Appl. Opt. 1980; 19 (21): 3651-3654.

Huber, R., et al., "Fourier Domain Mode Locked Lasers for OCT imaging at up to 290 kHz sweep rates," Proc. of SPIE-OSA Biomedical Optics, SPIE vol. 5861: (2005).

Klauminzer, GK, "Etalon-Grating Synchronized Scanning of a Narrowband Pulsed Dye Laser," Optical Engineering 1974; 13 (6): p. 528-530.

Shimizu, K., et al., "Measurement of Rayleigh Backscattering in Single-Mode Fibers Based on Coherent OFDR Employing a DFB Laser Diode," IEEE Photonics Technology Letters, 3(11): 1039-1041 (1991).

Takada, K. et al., "Rapidly-tunable narrowband light source with symmetrical crossing configuration for low coherence reflectometry," Electronics Letter, Jan. 5, 1995, vol. 31 (1) p. 63-65.

Takesue et al., "Broad-Band Lightwave Synthesized Frequency Sweeper Using Synchronous Filtering," J. of Lightwave Technology, 22(3): 755-762 (2004).

Telle et al., "Very rapid tuning of cw dye laser," Applied Physics Letters, 26(10): 572-574 (1975).

Yun, S.H., et al., "High-speed wavelength-swept semiconductor laser with a polygon-scanner-based wavelength filter," Optics Letters, 28(20): 1981-1983 (2003).

Yun, S.H., et al., "Interrogation of fiber grating sensor arrays with a wavelength-swept fiber laser," Optics Letters, 23(11): 843-845 (1998).

Yun, S.H., et al., "Wavelength-Swept Fiber Laser with Frequency Shifted Feedback and Resonantly Swept Intra-Cavity Acoustooptic Tunable Filter," IEEE Journal of Selected Topics in Quantum Electronics, 3(4): 1087-1096 (1997).

Written Opinion of the International Searching Authority mailed Jul. 15, 2010 (8 pgs.).

Morin et al., "Dispersion Control for Ultrafast Optics", TeraXion, 2009 (10 pgs.).

Biedermann et al., "Dispersion, coherence and noise of Fourier domain mode locked lasers", Optics Express 17(12): 9947-9961 (2009).

Bilenca et al., "Numerical study of wavelength-swept semiconductor ring lasers: the role of refractive-index nonlinearities in semiconductor optical amplifiers and implications for biomedical imaging applications", Optics Letters 31(6): 760-762 (2006).

* cited by examiner

METHODS, SYSTEMS, AND DEVICES FOR TIMING CONTROL IN ELECTROMAGNETIC RADIATION SOURCES

CROSS REFERENCE TO RELATED APPLICATIONS

This application is a divisional of U.S. application Ser. No. 13/048,441, filed on Mar. 15, 2011, the entire disclosure of which is incorporated by reference herein.

FIELD OF THE INVENTION

In part, aspects of the invention relate to components, methods and sources for generating and controlling electromagnetic radiation.

BACKGROUND

Various timing and other issues can limit the suitability of an electromagnetic radiation source, such as a laser, for a given application. For example, in certain sources a plurality of different optical frequencies are emitted from a given source over time as part of a swept laser configuration. Different types of swept lasers can be used as part of an optical coherence tomography system. In some instances, overcoming the limitations of a given source is important to being able to collect useable optical coherence data with respect to a sample. One such limitation is that when a source is swept periodically at a given sweep frequency using a tunable filter element, challenges arise relating to synchronizing the tunable filter element with other events. Synchronization difficulties can occur because of various dispersion effects such as those caused by optical fibers. In addition, synchronization difficulties can also occur because of various optical frequency shifts induced by components in the laser.

Accordingly, a need exists for improved sources, optical coherence tomography systems, and components of the foregoing to address various limitations and problems due to dispersion and other effects.

SUMMARY OF INVENTION

In part, the invention relates to an electromagnetic radiation source with improved timing control. In one embodiment, the source can include a Fourier domain mode locked (FDML) laser that overcomes several limitations of previously-known FDML laser designs. These limitations include timing errors between the propagation time of light inside the FDML cavity and the tuning properties of the tunable filter. Certain of these limitations are improved upon or overcome by compensating dispersion such as normal dispersion and anomalous dispersion. In turn, in another embodiment, certain limitations are improved upon or also overcome by compensating for the Doppler shift imparted to the light as it propagates through the tunable filter.

In one embodiment, the source includes or is in optical communication with a dispersion compensation module (DCM). The dispersion compensation module can include optical elements selected to compensate one or both of normal chromatic dispersion and anomalous chromatic dispersion. In addition, the DCM can be configured to reduce or remove dispersion from a source, a laser or a laser cavity. The DCM can remove all, or substantially all, of the dispersion that would otherwise be generated. In one embodiment, use of a DCM enables the generation of useable light output from both a forward and backward sweep direction of a tunable filter. In another embodiment, use of a DCM enables a high gain optical amplifier to be used within the laser cavity. In addition, use of a DCM enables an increase in coherence length.

In another embodiment, the source includes or is in optical communication with an optical frequency shifter (OFS). In one embodiment, the OFS imparts a frequency shift to the light inside the laser cavity that is equal in magnitude and opposite in direction to the frequency shift imparted by propagation through the tunable filter element. The frequency shift can be time varying in one embodiment.

In one embodiment, the invention relates to a laser having a wavelength range, a coherence length, and a laser cavity. The laser includes an optical delay line; a gain element in optical communication with the optical delay line; a first optical coupler in optical communication with the gain element; a dispersion compensation module in optical communication with the first optical coupler; and a bi-directionally tunable filter in optical communication with the dispersion compensation module, wherein the gain element, the bi-directionally tunable filter, and the dispersion compensation module are disposed in the laser cavity.

In one embodiment, the laser is a Fourier domain mode locked laser. The dispersion compensation module can be configured to reduce dispersion for a wavelength range centered at about 1310 nm. Further, in one embodiment, the dispersion compensation module is configured to reduce dispersion such that group delay mismatch in the laser cavity is less than about +/-10 picoseconds over the tuning range of the laser. In one embodiment, the laser also includes a second optical coupler and a control system, wherein the control system processes electromagnetic radiation received from the second coupler to generate a control signal to drive the tunable filter. The laser can also include a frequency shifter configured to compensate for a Doppler shift and wherein the bi-directionally tunable filter induces the Doppler shift. The laser can also include a frequency shifter configured to compensate for a Doppler shift and wherein the bi-directionally tunable filter and gain element induces the Doppler shift. The laser can also include a polarization controller in optical communication with the tunable filter and a first optical circulator in optical communication with the polarization controller.

In one embodiment, the control system sets the drive frequency of the tunable filter in response to a distinct symmetric pattern in an output signal of the laser, the output signal being obtained from the cavity using an output coupler disposed between the tunable filter and the gain element. The dispersion compensation module can include a first dispersion compensation element and a second dispersion compensation element, wherein the first dispersion compensation element reduces normal dispersion and wherein the second dispersion compensation element reduces anomalous dispersion. In one embodiment, the coherence length ranges from about 12 mm to about 30 mm. The gain element can be selected from the group consisting of a semiconductor optical amplifier, a high gain semiconductor optical amplifier, a polarized semiconductor optical amplifier, an optical amplifier, a dye cell, a laser crystal, and a doped optical fiber. In one embodiment, the gain element is a high-gain amplifier, having a small signal gain of at least 20 dB when the input power to the gain element is −20 dBm. In one embodiment, the gain element is a polarized amplifier, providing at least 10 dB more gain along a first polarization axis compared to gain provided along an orthogonal polarization axis.

In one embodiment, the invention relates to a method of improving coherence length in an optical radiation source.

The method includes the steps of generating a wavelength band using a gain element; transmitting the wavelength band through a cavity, the cavity comprising a dispersion compensation element; reducing one or both of anomalous dispersion and normal dispersion of the cavity using the dispersion compensation element; driving a tunable filter to transmit a subset of the wavelength band and generate an optical frequency sweep; and coupling out a portion of the optical frequency sweep and transmitting it to an optical coherence tomography system. In one embodiment, the wavelength band is selected from a band centered at a wavelength selected from the group consisting of about 800 nm, about 1060 nm, about 1310 nm, and about 1550 nm. The step of driving the tunable filter can include driving the filter in a forward direction and a backward direction. The method can also include the step of frequency shifting the subset of the wavelength band to compensate for a Doppler shift induced by the tunable filter. The step of driving the tunable filter can be performed using a linear drive signal. In one embodiment, the optical radiation source includes a Fourier domain modelocked laser.

In one embodiment, the invention relates to an optical coherence tomography system. The system includes a source of electromagnetic radiation having a laser cavity and a coherence length comprising a bi-directionally tunable filter disposed in the laser cavity; an interferometer in optical communication with the source; and an optical coherence tomography probe in optical communication with the interferometer, wherein the source comprises a dispersion compensation module configured to reduce at least one of anomalous dispersion or normal dispersion, the dispersion compensation module positioned within the laser cavity. The system can also include an optical frequency shifter configured to compensate for a Doppler shift induced by the tunable filter. In one embodiment, the tunable filter can be tuned to transmit light having a wavelength of from about 1200 nm to about 1400 nm and the coherence length of the laser ranges from about 12 mm to about 30 mm.

In one embodiment, the invention relates to a laser having a wavelength range and a coherence length. The laser can include a gain element; a first optical coupler in optical communication with the gain element; a tunable filter in optical communication with the first optical coupler; a polarization controller in optical communication with the tunable filter; an optical frequency shifter in optical communication with the polarization controller; a first optical circulator in optical communication with the frequency shifter; a fiber optic delay line in optical communication with the first optical circulator; and a reflector in optical communication with the fiber optic delay line. The laser can also include a dispersion compensation module, the dispersion compensation module configured to reduce dispersion in the laser cavity such that the group delay mismatch is reduced to less than about +/−10 picoseconds over a tuning range of the laser. In one embodiment, the optical frequency shifter is configured to apply an optical frequency shift of equal magnitude and in the opposite direction to the Doppler shift induced by the tunable filter.

In one embodiment, the invention relates to a method of compensating for a Doppler shift induced by a tunable filter in a laser. The method includes the steps of determining a Doppler shift frequency induced by at least one element disposed inside the laser; sweeping a tunable filter such that a plurality of Doppler shifted wavelengths are generated in a laser cavity; applying an optical frequency shift that is equal in magnitude and opposite in direction to the Doppler shift frequency using an optical frequency shifter in optical communication with the tunable filter; and transmitting a plurality of Doppler shift compensated wavelengths outside of the laser cavity. In one embodiment, the step of determining a Doppler shift frequency includes calculating a velocity of a moving element in the tunable filter that interacts with light passing through the tunable filter; calculating the Doppler shift frequency induced by a single interaction of light with the moving element using the velocity; calculating a number of interactions that light makes with the moving element during a single pass through the tunable filter; and multiplying the number of interactions with the Doppler shift induced by the single interaction of light with the moving element to estimate the total Doppler shift. In one embodiment, the method also includes the step of collecting optical coherence data using the Doppler shift compensated wavelengths.

This Summary is provided merely to introduce certain concepts and not to identify any key or essential features of the claimed subject matter.

BRIEF DESCRIPTION OF DRAWINGS

The figures are not necessarily to scale, emphasis instead generally being placed upon illustrative principles. The figures are to be considered illustrative in all aspects and are not intended to limit the invention, the scope of which is defined only by the claims.

DETAILED DESCRIPTION

Embodiments of the invention describe improved methods, systems, and devices, such as electromagnetic radiation sources for use with various data collection and imaging modalities such as optical coherence tomography.

Figure 1A:
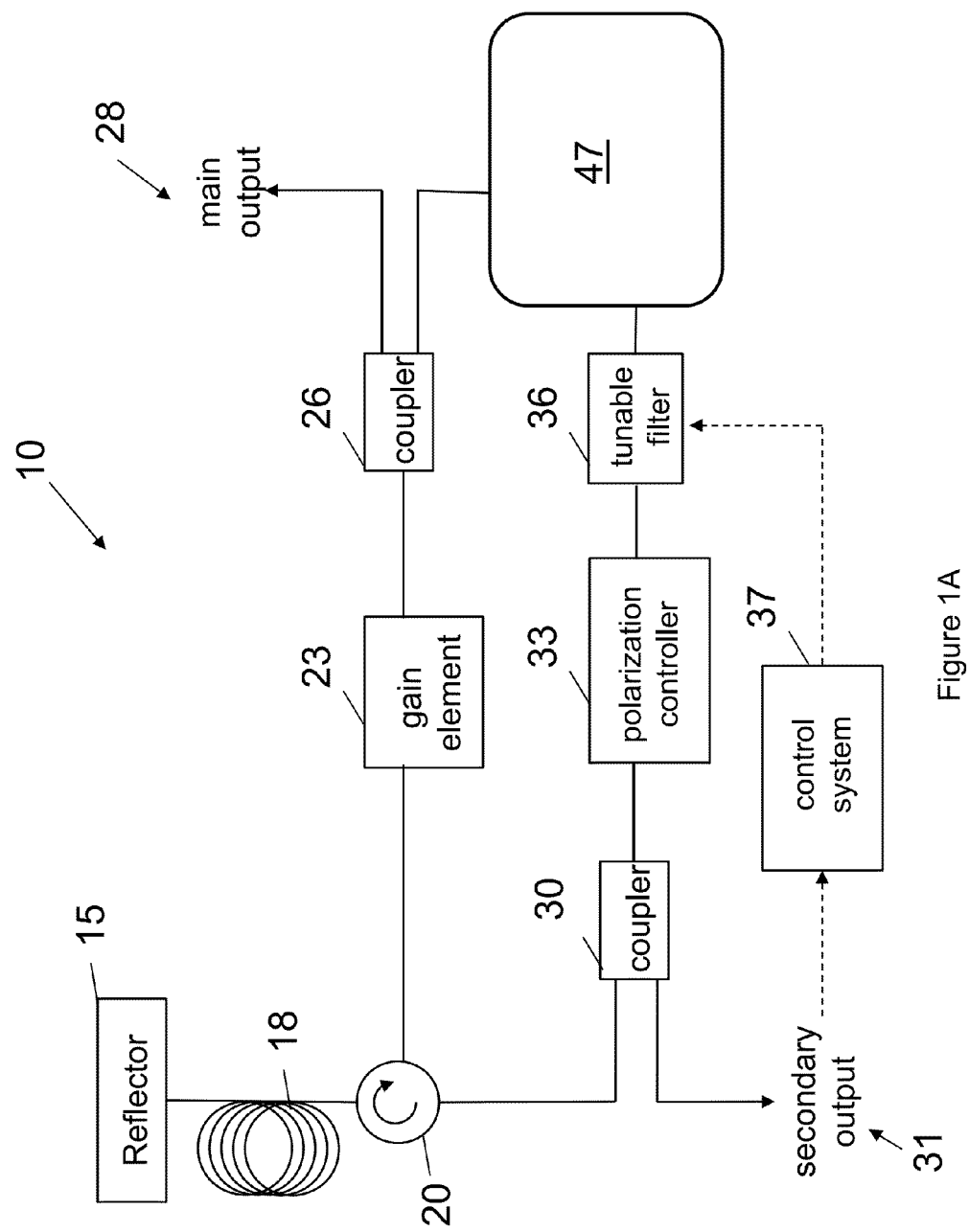
FIGS. 1A and 1B each show an electromagnetic radiation source and various related components in accordance with an illustrative embodiment of the invention.
Figure 4:
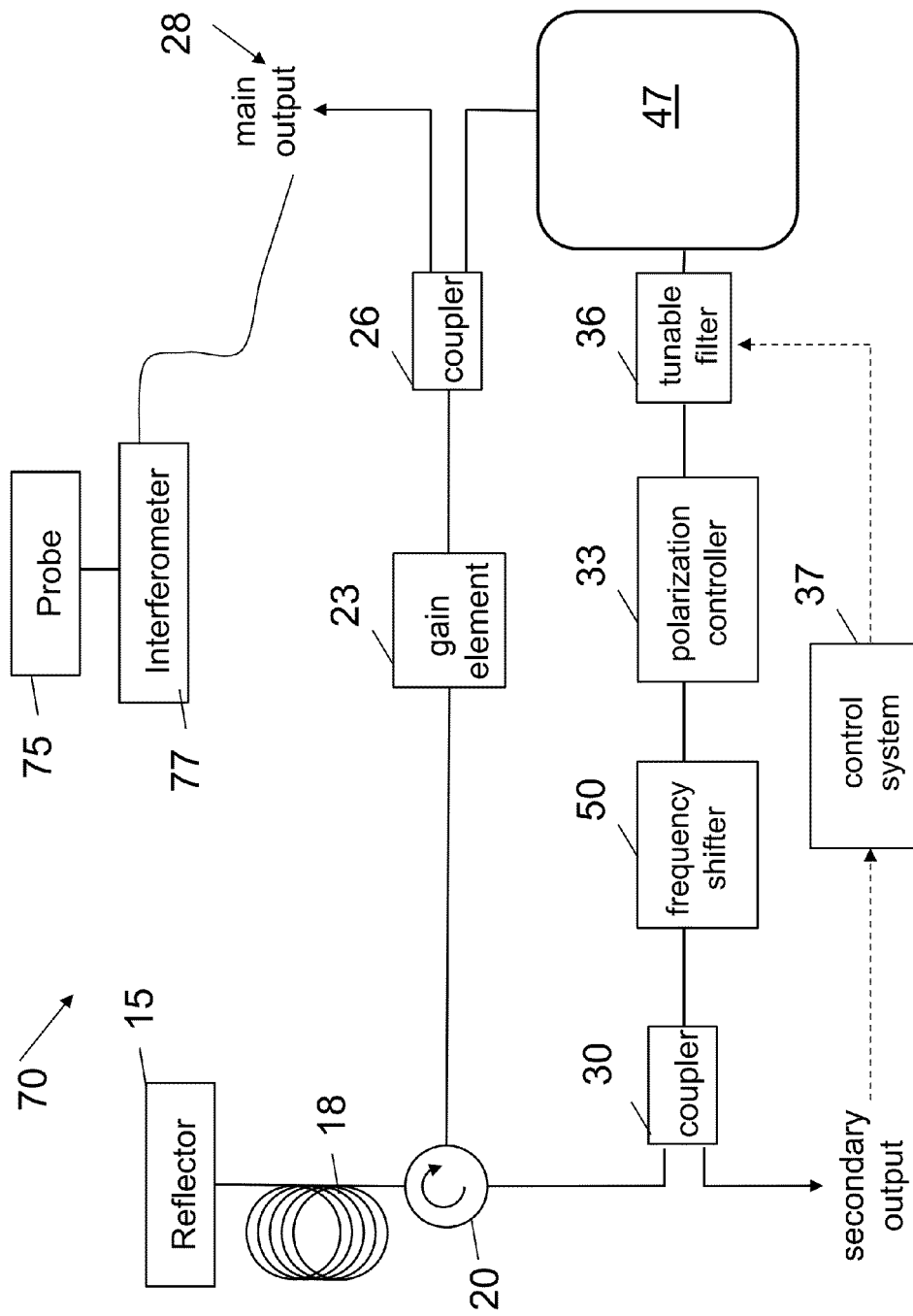
FIG. 4 shows an electromagnetic radiation source and various related components including a frequency shifter in accordance with another illustrative embodiment of the invention.

FIG. 1A shows a system that includes an electromagnetic radiation source 10 and various related components and outputs. In FIG. 1A, a general dispersion compensation module is shown. Similarly, in FIG. 1B a similar source 10' is shown with a specific dispersion compensation module as described below. In one embodiment, the system or subsystems shown form a source of electromagnetic radiation. This source is suitable for various purposes such as use as a light source in an optical coherence tomography data collection system. Specifically, the source 10 shown can be operated as a swept laser that produces a time-varying optical frequency output. The sources 10 and 10' in FIGS. 1A and 1B can be a Fourier domain mode locked (FDML) laser in one embodiment. In one embodiment, a source is composed of a cavity within which a gain element, dispersion compensation module, and filter are disposed. A frequency shifter may also be disposed within the cavity as shown in FIG. 4 and discussed in more detail below. In one embodiment, the frequency shifter is configured to compensate for the Doppler shift caused by the transmission of light through components in the source.

Figure 1B:
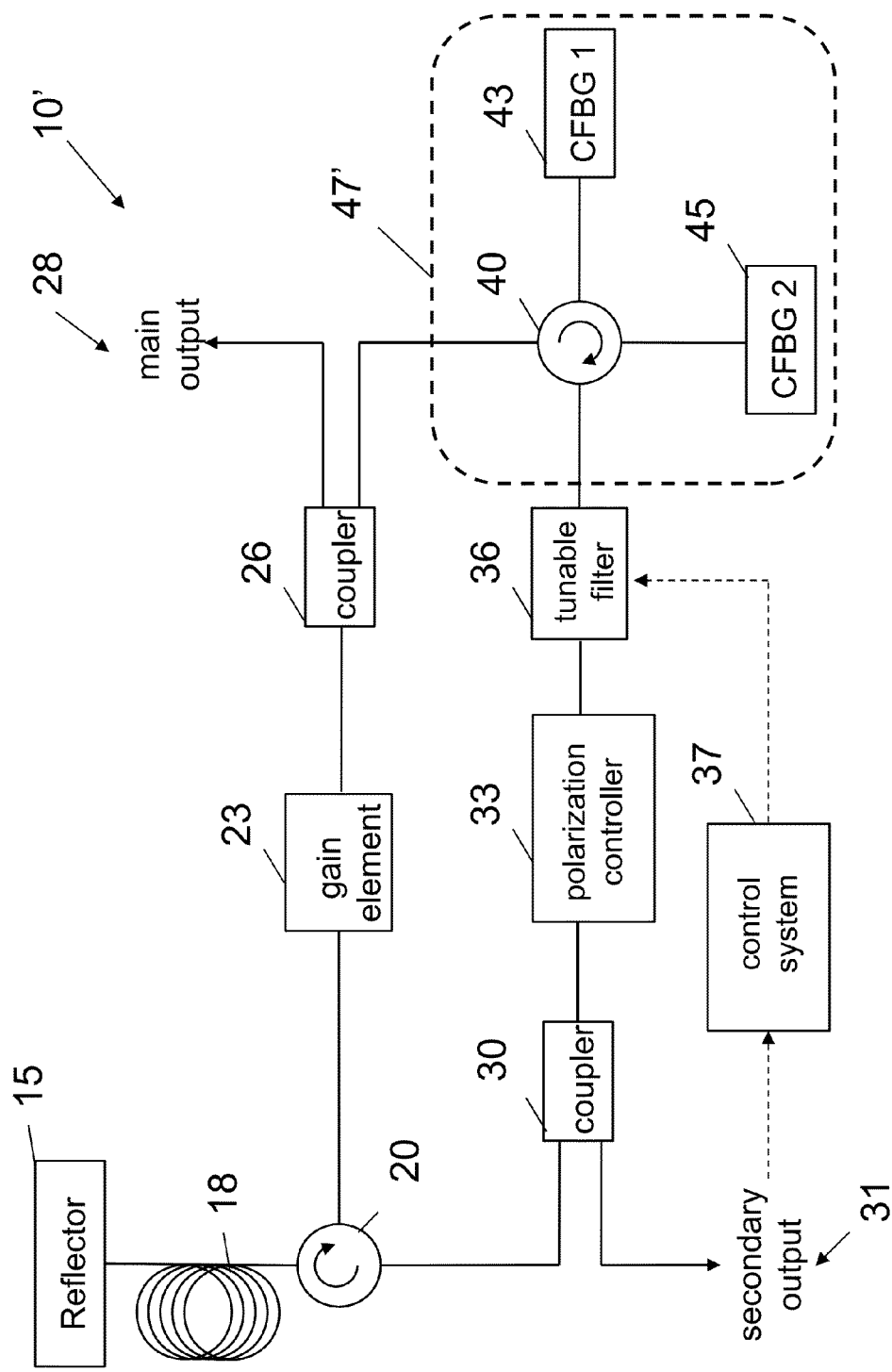

The paths and lines shown in FIGS. 1A, 1B and 4 between the different components of the system indicate that the components are or can be in optical communication with each other. Optical communication can be achieved through optical fibers, optical paths, alignment between the components, and as otherwise suitable for allowing electromagnetic radiation to pass to, from or between such components.

With respect to the system shown, starting at the top left side, a reflector 15 such as a mirror or Faraday rotator mirror is shown in optical communication with a length of optical fiber 18. This length of optical fiber 18 is chosen to serve as an optical delay line in one embodiment to facilitate Fourier domain mode locking operation of the source. In one embodiment, this optical fiber is a long length of optical fiber that is used to effectively store electromagnetic radiation that flows through one or more of the optical paths shown in FIGS. 1A and 1B. A first optical circulator 20 is in optical communication with the reflector 15. In one embodiment, the first circulator is a three port circulator.

As shown, in FIGS. 1A and 1B a gain element 23 is also in optical communication with a first coupler 26 and the first circulator 20. In one embodiment, the gain element is a semiconductor optical amplifier (SOA). The SOA can also be polarized, providing optical amplification predominantly along only one polarization state. A polarization controller can be used in the cavity as shown in FIGS. 1A and 1B to adjust for this type of SOA embodiment. It is understood that the gain element can also be a rare-earth doped optical fiber, a dye cell, a laser crystal, or any other material capable of providing light amplification.

The first coupler 26 has an optical path that leads to a main output 28. In one embodiment, between about 10% and about 70% of the power is transmitted at the first coupler through the main output 28. This main output can be used as a source for transmitting electromagnetic radiation to an optical coherence tomography system. Such an OCT system would typically include a fiber-based optical probe and interferometer, both of which would receive electromagnetic radiation from the main output 28. An example of this is shown in FIG. 4.

Coherence length is one performance parameter of radiation sources, such as those used for OCT imaging and other applications. Coherence length determines the maximum imaging range that can be interrogated with OCT. In one embodiment, the maximum imaging range over which the OCT sensitivity remains high enough to obtain high-quality images is typically about 50% of the coherence length of the radiation source. For large samples, such as the human coronary arteries or esophagus, a coherence length of at least about 12 mm is required. To enable more robust imaging of large luminal structures, for example to allow for eccentric placement of a side-looking catheter within the lumen or to allow for imaging of the left main coronary artery, a coherence length of at least about 16 mm and more preferably of at least about 18 mm is required. As shown in FIGS. 1A and 1B, a suitable gain element 23 such as a high-gain polarized semiconductor optical amplifier (SOA) can be used inside the cavity without degrading the coherence length.

Conventional FDML lasers require the use of a low-gain unpolarized SOA inside the cavity to obtain sufficient coherence lengths of about 12-about 18 mm for OCT data collection or imaging. Since the gain is low in the conventional case, output powers of these lasers are also low and a second booster SOA is required to obtain output powers sufficient for OCT imaging. This adds to system expense in the conventional case. The source embodiments shown in FIGS. 1A and 1B can obtain sufficient output power and coherence length for OCT imaging using a single polarized SOA. In one embodiment, the output power at the primary output 28 is about 40 mW or greater than 40 mW and is sufficient for OCT imaging using a single SOA.

Continuing in FIGS. 1A and 1B, the first circulator 20 is in optical communication with a second coupler 30 as shown. The second coupler 30 is also in optical communication with a secondary output 31 and a polarization controller 33 as shown. The polarization controller is used in some embodiments that use an SOA as the gain element or other gain elements that have polarization sensitivity. In one embodiment, the polarization controller aligns the polarization state of the light propagating inside the cavity to the polarization axis of the gain medium having maximum gain. The secondary output is received by a control system 37 and, along with other feedback signals, is used to control the tunable filter in one embodiment (shown in phantom). As shown, a tunable filter 36 is also in optical communication with the gain element 23 through coupler 26 and dispersion compensation module 47. Further, output from the secondary output coupler 30, when positioned in the cavity after the tunable filter 36 and before the gain element 23, simplifies adjustment and tracking of the laser drive frequency as described below.

In one embodiment, setting and maintaining a drive frequency for the tunable filter 36 is simplified by the use of output from the secondary output coupler 30 following the tunable filter element 36 and preceding the gain element 23. As shown in FIG. 1A, the tunable filer element 36 is in optical communication with a dispersion compensation module 47. This module 47 and a specific embodiment thereof are discussed below.

The sources 10, 10' shown can be used as the optical source for various data transmission and data collection systems. In a preferred embodiment, the sources operate as a mode locked laser that is suitable for data collection in an optical coherence tomography system. In the context of an optical coherence tomography system, a given source embodiment is in optical communication with a probe that transmits and receives light from the source to a sample of interest and an interferometer. Each source has a characteristic instantaneous power profile at each position in the cavity that may vary based on the components used. The instantaneous power profile of the source 10, 10' contains a distinctive symmetric profile at cavity locations following the tunable filter and preceding the gain element that is easy to identify using automated algorithms.

Figure 1C:
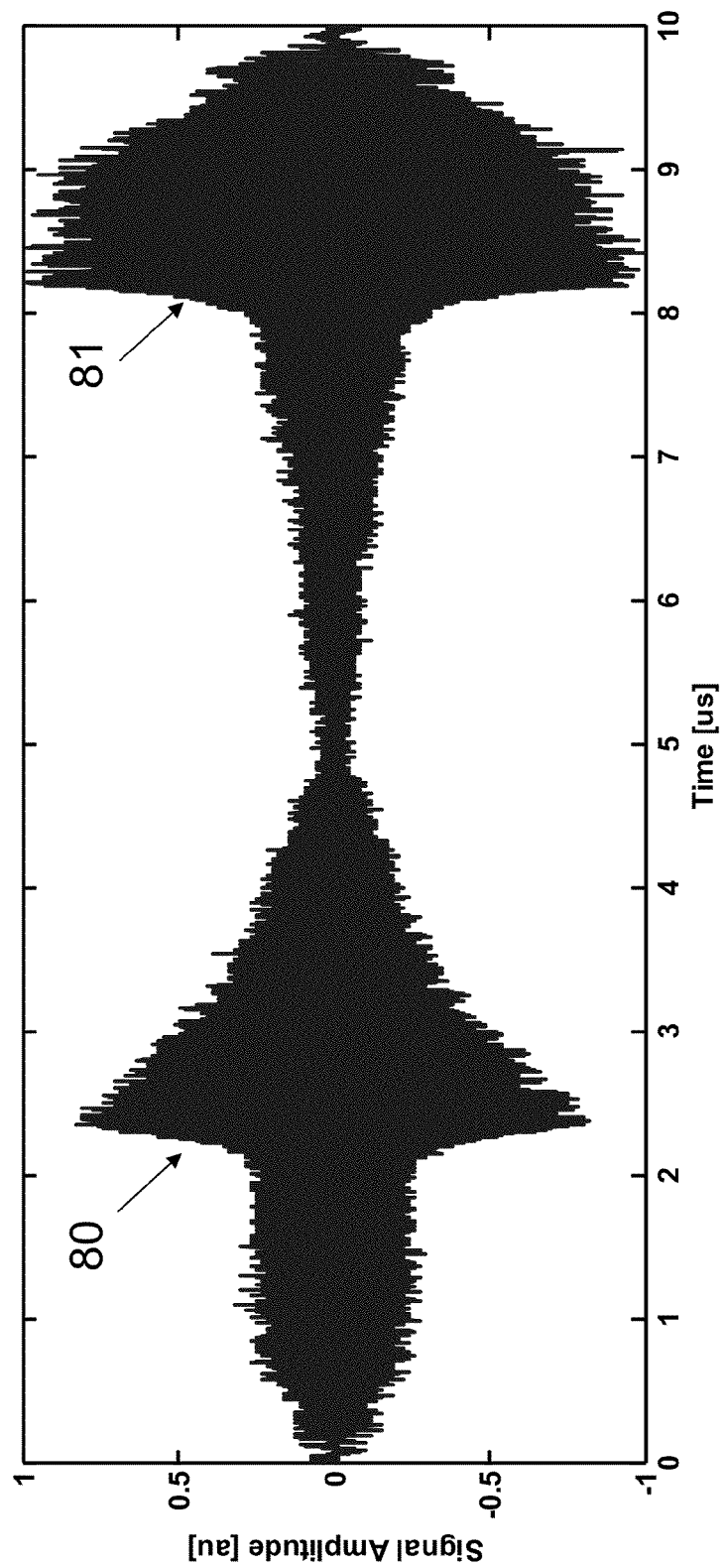
FIG. 1C shows a plot of an interference fringe signal generated from the forward and backward sweeps of a source in accordance with an illustrative embodiment of the invention.

An example of this distinctive profile is shown in FIG. 1C, which illustrates the interference fringes generated by a Mach-Zehnder interferometer according to one embodiment of the invention. The forward scan occupies the time period from about 0 to about 10 microseconds, and the backward scan occupies the time period from about 10 to about 20 microseconds. The distinct increase in fringe intensity approximately halfway through each scan direction (80, 81) is visible only when the tunable filter drive frequency is precisely matched to the roundtrip time of light in the laser cavity.

In addition, a similar pattern is observed in the noise of the sweep. A preferred or optimal filter drive frequency can therefore be obtained by monitoring the intensity or noise of the output obtained from the second coupler 30, and adjusting the frequency until this distinct pattern or profile is observed. This pattern or profile can be observed when the second coupler 30 is located after the tunable filter 36 and before the gain element 23. This profile can be used as a signature with respect to which the tunable filter, the frequency shifter (discussed below), or other components of the source 10, 10' can be adjusted and controlled to achieve a desirable operating state for the source. A polarization controller 33 is also in optical communication with the tunable filter 36.

The tunable filter 36 allows the source 10 to operate as a swept source for various applications such as OCT. The tunable filter can be adjusted using a control circuit or other feedback mechanisms to selectively pass a given wavelength or wavelength band over time. Thus, at a first time, the filter allows a first wavelength to pass and then at a later time the passband can be swept or changed to allow a second wavelength to pass.

Figure 3A:
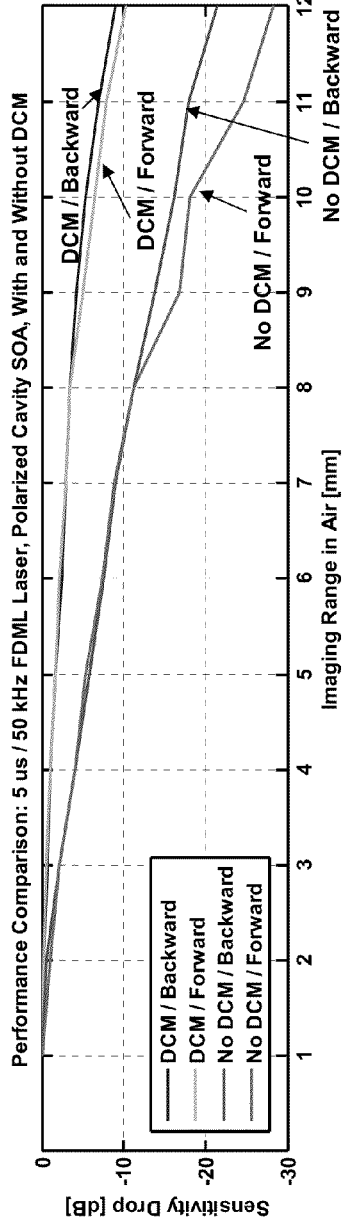
FIG. 3A shows a plot of various system parameters affected by dispersion in relation to sensitivity and imaging range, in accordance with an illustrative embodiment of the invention.
Figure 3B:
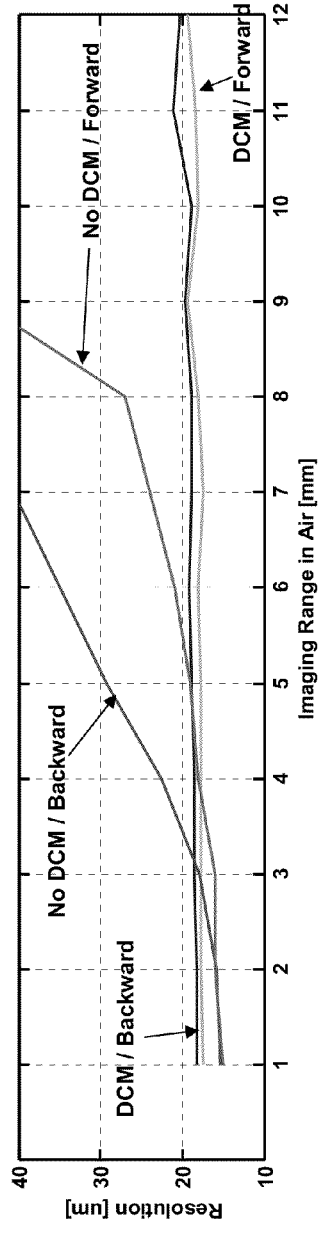
FIG. 3B shows a plot of various system parameters affected by dispersion in relation to resolution and imaging range, in accordance with an illustrative embodiment of the invention.

The tuning pattern of the filter can be periodic in time, such that it has a characteristic sweep frequency. In one embodiment, this sweep frequency can be in the range of about 25 kHz to about 1 MHz. The filter may have a wavelength tuning range of about 1200 nm to about 1400 nm. This filter can be swept first in a forward direction such that it selectively filters the short to long wavelengths, such as for example from about 1200 nm to about 1400 nm. In turn, the filter can be swept in a backward direction such that is selectively filters the long to short wavelengths, such as for example from about 1400 nm to about 1200 nm. In one embodiment, the optical properties of both the forward (short-to-long wavelength) and backward (long-to-short wavelength) sweep directions of laser source embodiments are similar, even at high sweep rates. Examples of this are shown in FIGS. 3A-3B.

In conventional FDML lasers, the optical properties of the forward and backward sweep directions are substantially different. Specifically, the dynamic range, sensitivity, and resolution of the OCT signals recorded during one sweep may degrade such that only a single sweep direction can be used. In the conventional case, this reduces the number of useable sweeps generated by the source by a factor of two, resulting in slower OCT data and/or image acquisition.

In one embodiment, the system, sources, methods and other implementations described herein operate at a wavelength that is centered at about 1310 nm with a wavelength range of about +/−about 100 nm. In another embodiment, the wavelength ranges can be centered at about 800 nm, 1060 nm, or 1550 nm. These wavelength ranges are suitable for OCT imaging due to a combination of low absorption and scattering from biological tissue near these wavelengths.

As shown in FIG. 1B, a specific DCM embodiment 47' is shown. This DCM 47' includes either two three-port optical circulators or a single four-port circulator 40 as shown. In one embodiment, a first fiber Bragg grating (FBG) 43 such as a chirped FBG (CFBG1) and a second FBG 45 such as a CFBG2 are also in optical communication with the second circulator 40 as shown in FIG. 1B. Dispersion control systems and devices using chirped fiber Bragg gratings are available from TeraXion, Inc. (360 Franquet St. Unit #40, Quebec, Quebec, Canada G1P 4S8). (See also Dispersion Control for Ultrafast Optics by Michel Morin Ph.D. and François Trépanier, Eng., Ph.D., TeraXion Inc., June 2009.)

In one embodiment, FIGS. 1A and 1B depict sources 10, 10' that each include a Fourier domain mode locked laser that exhibits low dispersion. This laser design enables use of both wavelength sweep directions, use of a high-gain polarized SOA inside the cavity, and significantly increases coherence length. Normal and anomalous dispersion are compensated by the selection of the properties and components used in a DCM 47. For example, with respect to the DCM 47' in FIG. 1B individual respective CFBGs 43, 45 or other dispersion compensating elements can be used to compensate for normal and anomalous dispersion. In one embodiment, the dispersion compensating elements for a given DCM 47 are matched to the elements forming the cavity, giving residual group delay mismatches of less than about +/−10 ps across the tuning range of the laser.

In one embodiment, the invention relates to a dispersion compensation module (DCM) 47 as shown in FIG. 1A. An alternate embodiment of a DCM 47' is shown in FIG. 1B. The DCM 47' as shown, in one embodiment, includes the first and second CFBGs as shown. The DCM also includes the second optical circulator 40 as shown. Notwithstanding the foregoing, the DCM modules 47, 47' are included in the respective sources 10, 10' to reduce dispersion and are not limited to the optical elements shown in FIGS. 1A and 1B. A DCM may be formed, for example, from a grating pair, a dispersion-shifted fiber, a photonic crystal fiber, or a dispersive glass.

Figure 2:
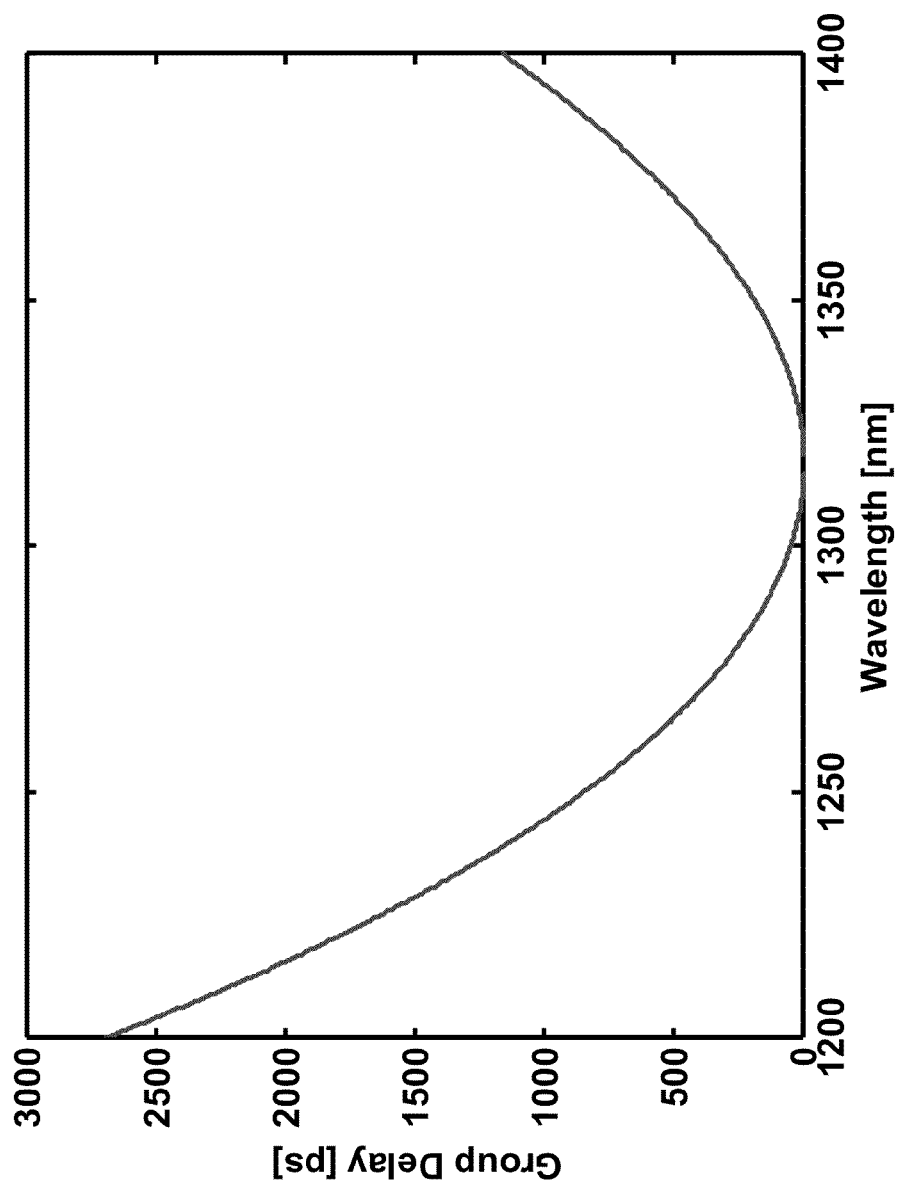
FIG. 2 shows the effects of dispersion in an optical fiber as plot of group delay versus wavelength in accordance with an illustrative embodiment of the invention.

Dispersion is an undesirable phenomenon when operating a source such as shown in FIGS. 1A and 1B. There are different types of dispersion that the DCM is configured to reduce. FIG. 2 shows the group delay in about a 4085 meter length of single mode fiber arising due to chromatic dispersion. A section of fiber of about half this length can be used as the fiber length or delay line 18, since the fiber length 18 is double-passed after reflection from the reflector 15 in one embodiment.

Uncompensated dispersion can result in group delay mismatches of hundreds to thousands of picoseconds across the tuning range. Group delay mismatch means the difference in group delay experienced by one wavelength of light compared to another wavelength of light as it propagates in or around the laser cavity, as applicable. Group delay mismatch has the negative effect of causing mis-synchronization between the light propagating in the FDML cavity and the tuning rate of the tunable filter. The filter, for example, can be tuned in a sinusoidal manner from 1260 nm to 1360 nm and back to 1260 nm at a sweep frequency of 50 kHz in order to match a cavity length of about 4085 meters of fiber. The filter will therefore undergo a single forward sweep from 1260 nm to 1360 nm in a time of about 10 microseconds, and a single backward sweep from 1360 nm to 1260 nm in a subsequent time of about 10 microseconds. Due to uncompensated dispersion, light at 1260 nm will require about an additional 600 ps to propagate around the cavity compared to light at the zero dispersion point of about 1317 nm. This timing error results in additional transmission losses in the tunable filter at wavelengths away from the zero dispersion point, which reduces photon lifetimes in the cavity and subsequently reduces coherence length. This subsequently impacts data collection such as when the source is used in a data collection modality such as OCT.

As shown in FIG. 2, the zero dispersion wavelength is at about 1317 nm when Corning SMF-28e+ single mode fiber is used to form the laser cavity. Normal dispersion is present at wavelengths less than 1317 nm. Anomalous dispersion is present at wavelengths greater than 1317 nm. In one embodiment, the DCM 47 is configured to reduce both anomalous dispersion and normal dispersion. Specifically, as shown, in one embodiment the first CFBG is selected and positioned to reduce anomalous dispersion and the second CFBG is selected and positioned to reduce normal dispersion or vice versa.

In the context of OCT data collection, in one embodiment, a single line of an OCT image can be generated from every wavelength sweep emitted by the light source. An FDML laser incorporating a tunable filter that sweeps periodically at a rate of 50 kHz produces 50,000 forward sweeps per second in addition to 50,000 backward sweeps per second. If both forward and backward sweep directions are of sufficient optical quality for OCT data collection, a total of 100,000 image lines per second can be recorded. However, the forward sweep direction of conventional FDML lasers can be too noisy for OCT imaging at high sweep rates, which necessitates the use of bulky, expensive optical buffering systems. Optical buffering systems use additional fiber lengths, couplers, polarization controllers, and optical amplifiers to copy the lower-noise sweep direction multiple times. The source embodiments described herein produce forward and backward sweeps with substantially the same optical quality, allowing OCT image lines to be acquired twice as quickly as conventional FDML lasers without the need for optical buffering.

The use of a DCM also offers improvements with respect to increasing the coherence length of the laser source. A typical FDML laser incorporating a polarized, high-gain SOA gain element inside the cavity at 1310 nm will have a coherence length typically less than 8 mm. In order to obtain a substantial improvement in coherence length (about 12-about 30 mm) embodiments of the invention reduce the difference in group delay (i.e., group delay mismatch) to less than about 100 picoseconds (ps) over a tuning range. It is preferable to reduce the difference in group delay to less than about 20 ps. The invention is directed in part to a DCM containing one or more dispersion reduction or compensating elements that are configured and positioned to reduce the group delay mismatch to less than about 100 picoseconds or less than or equal to about 20 ps.

Reducing the group delay mismatch in this manner also has the advantageous effect of reducing the disparity in optical quality of the forward (short-to-long) and backward (long-to-short) wavelength scans. When the optical quality (coherence length, power, noise, and tuning range) of the two sweep directions are substantially equivalent, twice as many OCT lines can be acquired over a given amount of time compared to the case where one sweep cannot be used. Thus, in one embodiment, the invention relates to DCMs that increase the coherence length such that is greater than about 14 mm. In one embodiment, the inclusion of a DCM results in a coherence length of between about 15 mm and about 20 mm. Further, in one embodiment, the coherence length is greater than about 20 mm.

Figure 3C:
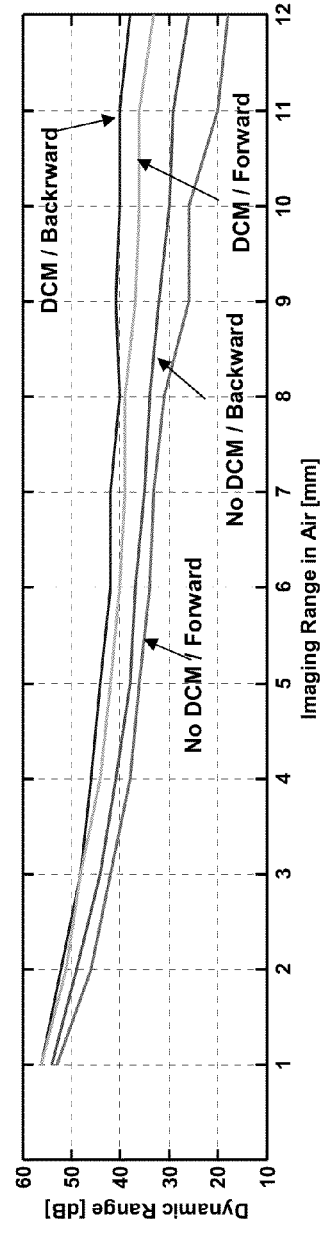
FIG. 3C shows a plot of various system parameters affected by dispersion in relation to dynamic range and imaging range, in accordance with an illustrative embodiment of the invention.

FIGS. 3A-3C show various plots that reveal the forward and backward sweeping options made possible with the DCM described herein and other specific advantages of the invention. In contrast, various data points when no DCM is used are also shown to emphasize the benefits of a DCM. Specifically, FIG. 3A shows a plot of measurements showing improved laser performance with one of the laser source embodiments of the invention with a DCM compared to a conventional FDML design. According to FIG. 3A, the coherence length is improved to 19.4 mm from 10.2 mm by using a DCM, an improvement of about a factor of 2. In FIG. 3A, the coherence length is estimated by measuring the imaging range at which the sensitivity drop is 6 dB, and multiplying this value by 2. In FIGS. 3B and 3C, the resolution and dynamic range of both sweep directions behave in a similar manner when a DCM is incorporated into the FDML laser. In other conventional FDML approaches, it is not possible to use both a forward and backward sweep for OCT imaging. This is another advantage of using a DCM. In addition, in one embodiment, when a DCM is used, the OCT imaging resolution remains about the same regardless of imaging range as shown in FIG. 3B. In another embodiment, when a DCM is not used in a conventional FDML laser, the resolution rapidly degrades in both sweep directions as the imaging range is increased as shown in FIG. 3B.

In one embodiment, the tuning range is reduced compared to a non-dispersion-compensated FDML laser. Dispersion compensating elements, such as a DCM, can provide compensation over only a finite range of wavelengths. The wavelength range of a DCM can be limited by many factors. For a DCM based on FBG components, for example, the FBG can be only a finite physical length on the order of 5 cm-200 cm. FBGs generate a defined amount of group delay by reflecting different wavelengths at different parts of the fiber, such that each wavelength experiences a different time of flight in the FBG. The operating wavelength range of the FBG is therefore determined by the total group delay induced by the FBG in conjunction with the physical length of the FBG. An FBG having a length of about 10 cm designed to compensate for about 600 ps of group delay can operate over a wavelength range of about 100 nm.

Doppler Shifting Components and Embodiments

Another source of timing mismatch between the light propagating around the laser cavity and the tunable filter is an optical frequency shift imparted on the light as it passes through components inside the cavity. One component that can induce an undesired optical frequency shift is the tunable filter. Many types of tunable filters, such as Fabry-Perot filters, filters incorporating diffraction gratings and movable mirrors, and polygon scanning filters incorporate a moving device to tune the transmission wavelength of the filter. In fiber Fabry-Perot filters commonly used in FDML lasers, a piezoelectric transducer moves one face of the Fabry-Perot structure relative to the other face in order to tune the filter. This motion imparts a Doppler shift onto the light as it travels through the filter. Doppler shifts may also be imparted by acousto-optic tunable filters, electro-optic tunable filters, and liquid crystal tunable filters. In one sweep direction, as the movable Fabry-Perot face travels away from the fixed face, the light is red-shifted to a lower optical frequency. In the other sweep direction, as the movable Fabry-Perot face travels towards the fixed face, the light is blue-shifted to a higher optical frequency.

The optical frequency shift has the effect of moving the wavelength of light passing through the filter away from the center of the filter passband. This effect is similar to the effect of group delay mismatch, and results in increased attenuation as the light passes through the filter. This reduces the coherence length and increases the noise of the light generated by the laser. Furthermore, since the optical frequency shift is caused by motion of the tunable filter itself, it is not possible to compensate for the shift by altering the filter tuning frequency.

Instead, compensation can be obtained by adding an optical frequency shifter 50 into the electromagnetic radiation source 70 as shown in FIG. 4. The frequency shifter 50 can be positioned anywhere in the cavity. The optical frequency shifter can be an acousto-optic frequency shifter, an electro-optic frequency shifter, a phase modulator, an air gap with a rapidly variable gap length, a fiber stretcher with a rapidly variable path length, or any other device capable of shifting the optical frequency of incident light. To compensate for the Doppler shift induced by the tunable filter 36, the frequency shifter 50 can be configured to apply an equal and opposite Doppler shift. If the tunable filter 36 is operated in a periodic manner, the frequency shifter 50 should be synchronized to the tunable filter period. The Doppler shift compensated wavelengths that are transmitted from the coupler can be used to collect optical coherence tomography data.

It is desirable to compensate for the frequency shift caused by the tunable filter 36 as completely as possible, in order to minimize timing errors in the laser cavity and thereby optimize laser performance. While one embodiment focuses on optical frequency shifts induced by the tunable filter 36, it is understood that this concept can be extended to compensate for optical frequency shifts caused by other components in the laser such as the gain medium 23. As an example, the case where the tunable filter 36 is a fiber Fabry-Perot tunable filter (FFP-TF) of the type commonly used in FDML lasers is described below. It is understood that this concept also facilitates compensation for optical frequency shifts caused by any other type of tunable filter 36.

As shown in FIG. 4, a probe such as an optical coherence tomography probe 75 is shown. In one embodiment, the probe includes a rotatable fiber disposed within a catheter. The probe can be sized for insertion into a sample or lumen of interest, such as a blood vessel or artery. In one embodiment, the probe is in communication with an interferometer 77. The interferometer may be a Michelson interferometer, and the probe may form a portion of the sample arm of the interferometer. In one embodiment, the probe receives electromagnetic radiation directed from the main output 28 to the interferometer 77. The probe in turn directs light into a sample and collects reflected light from the sample. The interferometer 77 is used in accordance with optical coherence tomography principles to generate depth information based on the light from the source 70 and the light collected from the sample.

To obtain optimal compensation of the frequency shift, in one embodiment, the following steps are followed. First, the amount of optical frequency shift generated by a single trip through the tunable filter is determined or calculated. Second, the frequency shifter 50 is configured to generate the same magnitude of optical frequency shift but in the opposite direction. Third, the frequency shifter 50 is synchronized to the tunable filter to ensure that the correct compensating frequency shift is applied at the correct moments in time.

Figure 5:
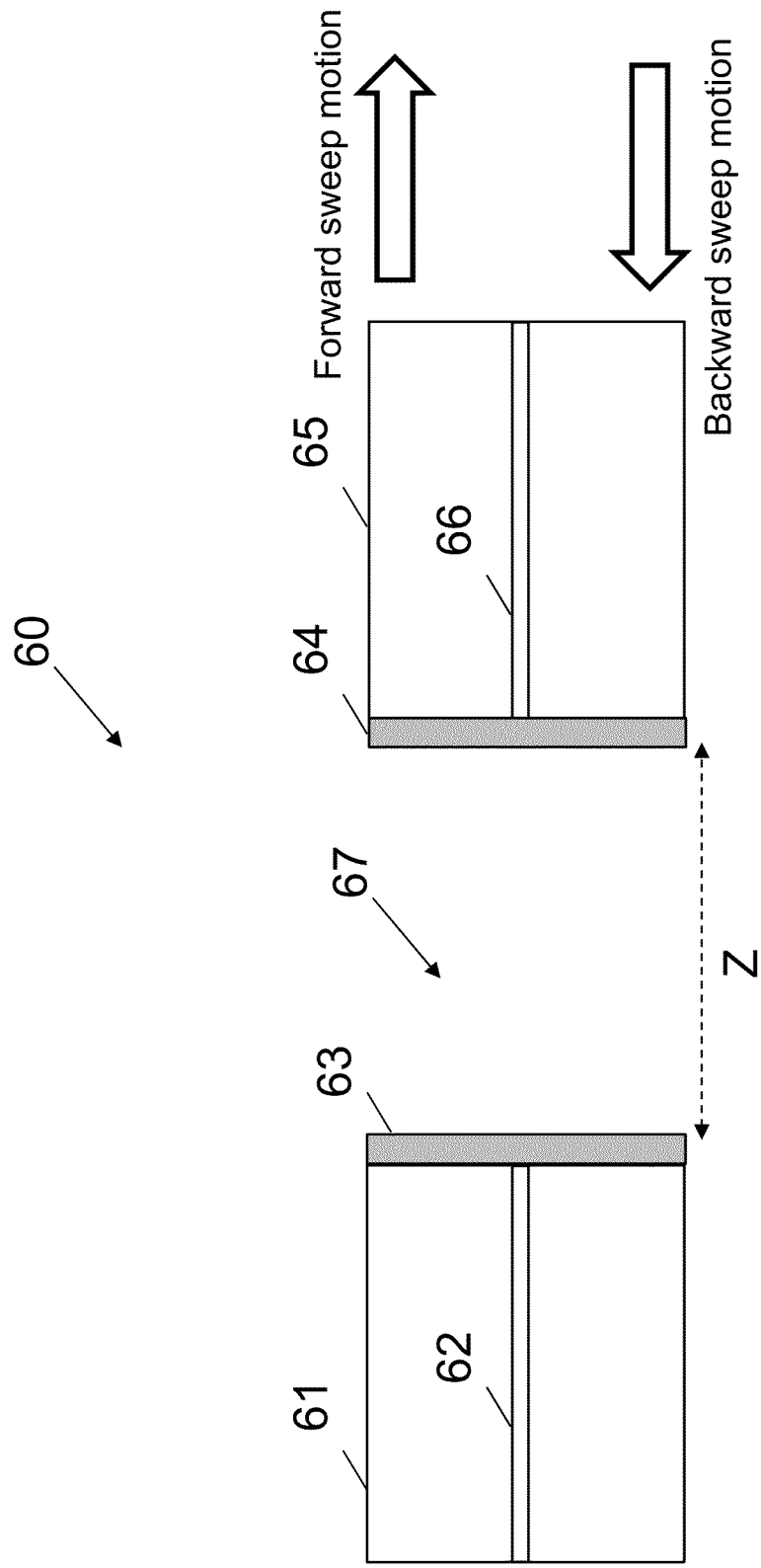
FIG. 5 is a schematic diagram of certain components of a tunable filter in accordance with an illustrative embodiment of the invention.

The following is meant to illustrate, by way of example, a method for determining the amount of optical frequency shift generated by a single trip through a FFP-TF. FIG. 5 shows a schematic diagram of internal components 60 of a fiber Fabry-Perot tunable filter. Light enters an input ferrule 61 having an optically guiding core 62 and a partially-reflective coated face 63. An output ferrule 65 is provided, also having a partially-reflective coated face 64 and an optically guiding core 66. Although the faces 63 and 64 are shown as flat, one or both may be curved so as to provide a light focusing function. The two faces form an optical cavity 67 having length Z. Only light with an optical frequency matching the resonant mode of the cavity 67 will be transmitted through the filter. Light making a single pass through the filter from the input ferrule 61 to the output ferrule 65 will bounce back and forth in the cavity 67 N times prior to exiting the filter.

As the filter tunes, one ferrule moves relative to the other in order to change the cavity length Z. In this example, the output ferrule 65 is shown as moving while the input ferrule 61 is shown as being fixed in place. It is understood that either or both ferrules may move in order to tune the filter transmission wavelength. Each time a photon interacts with a moving surface such as the partially-reflective face 64, it experiences a Doppler shift related to the velocity of the face motion. This Doppler shift may be determined using various computer-based embodiments described below. In one embodiment, a fixed Doppler shift is determined and stored as a fixed value that is used to control a frequency shifter. This value can be stored as part of an ASIC, FPGA, or microcontroller that are part of a control system in one embodiment. In other embodiments, the Doppler shift may change over time and be calculated over time using one of the computer-based embodiments described below.

To determine the optical frequency shift imparted to light as it passes through the FFP-TF a single time, it is necessary to calculate the Doppler shift D imparted by the moving ferrule and multiply this by the number of cavity bounces N, such that the total Doppler shift $D_T$ is given by $D_T=ND$. The Doppler shift from a single cavity bounce is given by $$D = \frac{\pm 2Vv}{c},$$

where V is the velocity of the face 64, v is the optical frequency of the light, and c is the speed of light in the cavity. D is positive when the face 64 is moving towards the fixed face 63, and is negative when the face 64 is moving away from the fixed face 63.

The face velocity V is given by $$V = \frac{d}{dt}(Z(t)),$$

where Z(t) is the time-varying length of the cavity. Face velocity is a function of the tuning range, sweep frequency, filter drive waveform, and filter order q. In particular, the optical frequency v(t) transmitted by the filter is given by $$v(t) = \frac{qc}{2Z(t)},$$

where q is a fixed integer corresponding to the filter order. Therefore the total Doppler shift as a function of time $D_T(t)$ is given by $$D_T(t) = N \frac{\pm q}{Z(t)} \frac{dZ(t)}{dt}.$$

The number of cavity bounces N experienced by a photon propagating through the filter can be estimated as $$N = \frac{c\tau_p}{2Z}$$

where $\tau_p$ is the characteristic decay time of the cavity at which point the light intensity has decayed to 1/e of its original value and Z is taken as the optical cavity length when the filter is tuned to the center wavelength of its tuning range. The characteristic decay time is calculated as $\tau_p = 1/c\alpha_r$ where $\alpha_r$ is the effective overall distributed-loss coefficient of the cavity. When the faces 63 and 64 are highly reflective and the losses in the cavity are low, then $\alpha_r$ can be approximated as $$\alpha_r = \frac{\pi}{FZ}$$

where F is the finesse of the filter. This gives an estimate for the number of cavity bounces as $$N = \frac{F}{2\pi}.$$

The total Doppler shift to be compensated by the frequency shifter 50 is therefore:

$$D_T(t) = \frac{F}{2\pi} \frac{\pm q}{Z(t)} \frac{dZ(t)}{dt}.$$

Figure 6B:
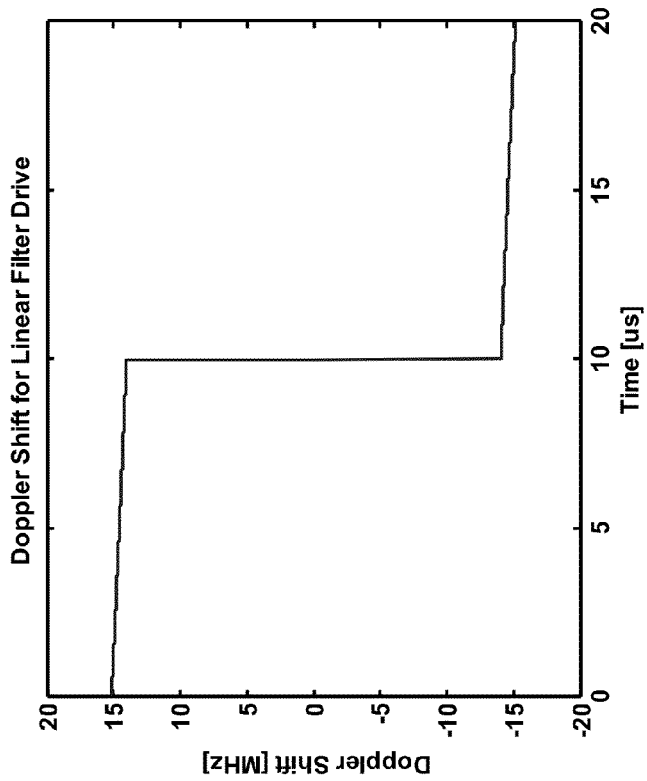
FIG. 6B is a plot of a Doppler shift over time for a tunable filter drive with a linear drive signal in accordance with an illustrative embodiment of the invention.
Figure 6A:
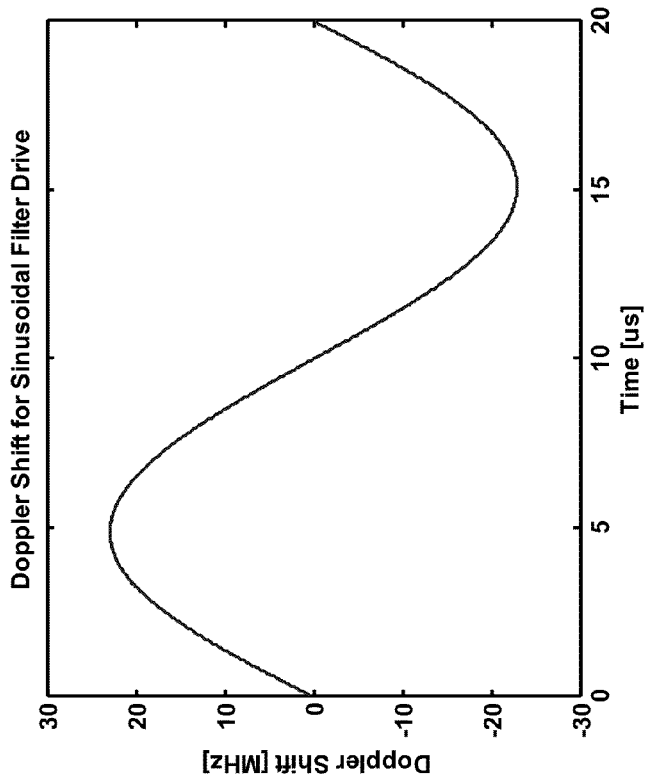
FIG. 6A is a plot of a Doppler shift over time for a tunable filter drive with a sinsusoidal drive signal in accordance with an illustrative embodiment of the invention.

FIG. 6A shows an example of the Doppler shift $D_T$ generated by a filter having a center wavelength of 1310 nm, a free spectral range of 120 nm, a finesse of 1000, and a q value of 12. In this example, the filter is tuned over 100 nm at a frequency of 50 kHz with a sinusoidal waveform. The total Doppler shift $D_T$ varies from 0 MHz to approximately 23 MHz during the forward sweep, which occurs during the time interval of 0 to 10 microseconds. The total Doppler shift $D_T$ varies from 0 MHz to approximately −23 MHz during the backward sweep, which occurs during the time interval of 10 microseconds to 20 microseconds. In this example, the frequency shifter 50 would be required to induce an approximately sinusoidal frequency shift with an equal magnitude and opposite sign to the total Doppler shift $D_T$ induced by the tunable filter.

Many frequency shifters, such as acousto-optic frequency shifters, can induce optical frequency shifts over only a narrow bandwidth. This limitation makes it challenging to fully compensate for the Doppler shift induced by a tunable filter that is swept with a sinusoidal waveform, since the Doppler shift varies from near 0 MHz to tens of MHz during a single sweep. To circumvent this limitation, the tunable filter can be swept with a linear waveform such that the time-varying length of the cavity Z(t) is similar to a ramp function.

FIG. 6B shows the total Doppler shift $D_T$ induced by a tunable filter having a center wavelength of 1310 nm, a free spectral range of 120 nm, a finesse of 1000, and a q value of 12. In this example, the filter is tuned over 100 nm at a frequency of 50 kHz with a triangular waveform. The total Doppler shift $D_T$ varies from approximately 15.2 MHz to approximately 14.1 MHz during the forward sweep, which occurs during the time interval of 0 microseconds to 10 microseconds. The total Doppler shift $D_T$ varies from approximately −14.1 MHz to approximately −15.2 MHz during the backward sweep, which occurs during the time interval of 10 microseconds to 20 microseconds. In this example, the frequency shifter 50 operates over a much narrower range of frequencies, simplifying the frequency shifter 50 design and reducing costs. Acousto-optic frequency shifters are typically capable of producing only a positive or only a negative frequency shift. Two acousto-optic frequency shifters, one configured to apply a frequency shift of about −14.6 MHz+/− about 0.6 MHz and one configured to apply a frequency shift of about 14.6 MHz+/−about 0.6 MHz, can be used in series to compensate for the total Doppler shift in this example.

Thus, by driving a tunable filter with a linear signal the Doppler shift that occurs remains within a narrowly constrained band of frequencies. As a result, one specific Doppler shift value or a narrow range of Doppler shift values can be determined as described above when a linear drive signal is used. In contrast, when the filter is driven with a sinusoid the frequency shifting is very complicated with non-linear frequency changes. By using a linear drive signal such as a one-way ramp, an up-down ramp, sawtooth, or other suitable linear function, the filter is driven at a substantially constant speed and a frequency shifter 50 can be used to compensate with a narrow range of frequencies. In the time varying case, a computer, processor, or other control system can be used to change the Doppler shift frequency used by the frequency shifter 50.

In the description, the invention is discussed in the context of optical coherence tomography; however, these embodiments are not intended to be limiting and those skilled in the art will appreciate that the invention can also be used for other imaging and diagnostic modalities, instruments for interferometric sensing, or optical systems in general.

The aspects, embodiments, features, and examples of the invention are to be considered illustrative in all respects and are not intended to limit the invention, the scope of which is defined only by the claims. Other embodiments, modifications, and usages will be apparent to those skilled in the art without departing from the spirit and scope of the claimed invention.

The use of headings and sections in the application is not meant to limit the invention; each section can apply to any aspect, embodiment, or feature of the invention.

Throughout the application, where compositions are described as having, including, or comprising specific components, or where processes are described as having, including or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components and can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes," "including," "have," "has," or "having" should be generally understood as open-ended and non-limiting unless specifically stated otherwise.

The use of the singular herein includes the plural (and vice versa) unless specifically stated otherwise. Moreover, the singular forms "a," "an," and "the" include plural forms unless the context clearly dictates otherwise. In addition, where the use of the term "about" is before a quantitative value, the present teachings also include the specific quantitative value itself, unless specifically stated otherwise. As used herein, the term "about" refers to a ±20% variation from the nominal value.

It should be understood that the order of steps or order for performing certain actions is immaterial so long as the present teachings remain operable. Moreover, two or more steps or actions may be conducted simultaneously.

Where a range or list of values is provided, each intervening value between the upper and lower limits of that range or list of values is individually contemplated and is encompassed within the invention as if each value were specifically enumerated herein. In addition, smaller ranges between and including the upper and lower limits of a given range are contemplated and encompassed within the invention. The listing of exemplary values or ranges is not a disclaimer of other values or ranges between and including the upper and lower limits of a given range.

Non-Limiting Software Features and Embodiments for Implementing DCM and OFS Methods and Devices The present invention may be embodied in many different forms, including, but in no way limited to, computer program logic for use with a processor (e.g., a microprocessor, microcontroller, digital signal processor, or general purpose computer), programmable logic for use with a programmable logic device, (e.g., a Field Programmable Gate Array (FPGA) or other PLD), discrete components, integrated circuitry (e.g., an Application Specific Integrated Circuit (ASIC)), or any other means including any combination thereof. In one embodiment of the present invention, some or all of the processing of the data collected using an OCT probe is implemented as a set of computer program instructions that is converted into a computer executable form, stored as such in a computer readable medium, and executed by a microprocessor under the control of an operating system. Control and operation of components of a given laser can also be so controlled or operated using a computer. In embodiment, light or photodiode signals or other data are transformed into processor understandable instructions suitable for generating drive signals for tunable filters, determining Doppler shift values, modeling the moving components of a tunable filter, controlling a tunable filter, signal processing, sweeping a tunable filter in a first and second direction and other features and embodiments as described above.

Computer program logic implementing all or part of the functionality previously described herein may be embodied in various forms, including, but in no way limited to, a source code form, a computer executable form, and various intermediate forms (e.g., forms generated by an assembler, compiler, linker, or locator). Source code may include a series of computer program instructions implemented in any of various programming languages (e.g., an object code, an assembly language, or a high-level language such as Fortran, C, C++, JAVA, or HTML) for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

The computer program may be fixed in any form (e.g., source code form, computer executable form, or an intermediate form) either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), a PC card (e.g., PCMCIA card), or other memory device. The computer program may be fixed in any form in a signal that is transmittable to a computer using any of various communication technologies, including, but in no way limited to, analog technologies, digital technologies, optical technologies, wireless technologies networking technologies, and internetworking technologies. The computer program may be distributed in any form as a removable storage medium with accompanying printed or electronic documentation (e.g., shrink-wrapped software), preloaded with a computer system (e.g., on system ROM or fixed disk), or distributed over a network.

Programmable logic may be fixed either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), or other memory device. The programmable logic may be fixed in a signal that is transmittable to a computer using any of various communication technologies, including, but in no way limited to, analog technologies, digital technologies, optical technologies, wireless technologies (e.g., Bluetooth), networking technologies, and internetworking technologies. The programmable logic may be distributed as a removable storage medium with accompanying printed or electronic documentation (e.g., shrink-wrapped software), preloaded with a computer system (e.g., on system ROM or fixed disk), or distributed from a server or electronic bulletin board over the communication system (e.g., the Internet or World Wide Web).

Various examples of suitable processing modules are discussed below in more detail. As used herein a module refers to software, hardware, or firmware suitable for performing a specific data processing or data transmission task. Typically, in a preferred embodiment a module refers to a software routine, program, or other memory resident application suitable for receiving, transforming, routing and processing instructions, or various types of data such as OCT scan data, interferometer signal data, filter drive signals, linear drive signals, determination of Doppler shift values on fixed or real time basis, and other information of interest.

Computers and computer systems described herein may include operatively associated computer-readable media such as memory for storing software applications used in obtaining, processing, storing and/or communicating data. It can be appreciated that such memory can be internal, external, remote or local with respect to its operatively associated computer or computer system.

Memory may also include any means for storing software or other instructions including, for example and without limitation, a hard disk, an optical disk, floppy disk, DVD (digital versatile disc), CD (compact disc), memory stick, flash memory, ROM (read only memory), RAM (random access memory), DRAM (dynamic random access memory), PROM (programmable ROM), EEPROM (extended erasable PROM), and/or other like computer-readable media.

In general, computer-readable memory media applied in association with embodiments of the invention described herein may include any memory medium capable of storing instructions executed by a programmable apparatus. Where applicable, method steps described herein may be embodied or executed as instructions stored on a computer-readable memory medium or memory media.

It is to be understood that the figures and descriptions of the invention have been simplified to illustrate elements that are relevant for a clear understanding of the invention, while eliminating, for purposes of clarity, other elements. Those of ordinary skill in the art will recognize, however, that these and other elements may be desirable. However, because such elements are well known in the art, and because they do not facilitate a better understanding of the invention, a discussion of such elements is not provided herein. It should be appreciated that the figures are presented for illustrative purposes and not as construction drawings. Omitted details and modifications or alternative embodiments are within the purview of persons of ordinary skill in the art.

It can be appreciated that, in certain aspects of the invention, a single component may be replaced by multiple components, and multiple components may be replaced by a single component, to provide an element or structure or to perform a given function or functions. Except where such substitution would not be operative to practice certain embodiments of the invention, such substitution is considered within the scope of the invention.

The examples presented herein are intended to illustrate potential and specific implementations of the invention. It can be appreciated that the examples are intended primarily for purposes of illustration of the invention for those skilled in the art. There may be variations to these diagrams or the operations described herein without departing from the spirit of the invention. For instance, in certain cases, method steps or operations may be performed or executed in differing order, or operations may be added, deleted or modified.

Furthermore, whereas particular embodiments of the invention have been described herein for the purpose of illustrating the invention and not for the purpose of limiting the same, it will be appreciated by those of ordinary skill in the art that numerous variations of the details, materials and arrangement of elements, steps, structures, and/or parts may be made within the principle and scope of the invention without departing from the invention as described in the claims.

What is claimed is:

1. A method of compensating for a Doppler shift induced by a tunable filter in a laser comprising
   determining a Doppler shift frequency induced by at least one element disposed inside the laser;
   sweeping a tunable filter such that a plurality of Doppler shifted wavelengths are generated in a laser cavity;
   applying an optical frequency shift that is equal in magnitude and opposite in direction to the Doppler shift frequency using an optical frequency shifter in optical communication with the tunable filter; and
   transmitting a plurality of Doppler shift compensated wavelengths outside of the laser cavity.

2. The method of claim 1 wherein the step of determining a Doppler shift frequency comprises
   calculating a velocity of a moving element in the tunable filter that interacts with light passing through the tunable filter;
   calculating the Doppler shift frequency induced by a single interaction of light with the moving element using the velocity;
   calculating a number of interactions that light makes with the moving element during a single pass through the tunable filter; and
   multiplying the number of interactions with the Doppler shift induced by the single interaction of light with the moving element to estimate the total Doppler shift.

3. The method of claim 1 further comprising the step of collecting optical coherence data using the Doppler shift compensated wavelengths.

4. The method of claim 1 wherein sweeping the tunable filter comprises sweeping the tunable filter in forward direction and in a backward direction.

5. A laser having a wavelength range and a coherence length comprising:
   a laser cavity;
   an optical delay line;
   a gain element in optical communication with the optical delay line;
   a first optical coupler in optical communication with the gain element;
   a dispersion compensation module in optical communication with the first optical coupler;
   a bi-directionally tunable filter in optical communication with the dispersion compensation module, and
   a frequency shifter in optical communication with the dispersion compensation module,
   wherein the gain element, the bi-directionally tunable filter, and the dispersion compensation module are disposed in the laser cavity.

6. The laser of claim 5 further comprising a control system in electrical communication with the tunable filter,
   wherein the control system is configured to transmit an electrical control signal to tunable filter in response to an optical signal from the gain element.

7. The laser of claim 6 further comprising a second optical coupler in optical communication with the gain element and the tunable filter, wherein the second optical coupler comprises a secondary output configured to transmit the optical signal from the gain element to the control system.

8. The laser of claim 5 wherein the dispersion compensation module comprises:
   a first chirped fiber Bragg grating having an input;
   a second chirped fiber Bragg grating having an input; and
   a four port circulator, wherein a first port is an input port, a second port is an output port, a third port is in optical communication with input of the first chirped fiber Bragg grating, and a fourth port is in optical communication with input of the second chirped fiber Bragg grating.

9. The laser of claim 5 further comprising a reflector in optical communication with the optical delay line.

10. The laser of claim 5 further comprising a polarization controller in optical communication with the frequency shifter and the tunable filter.

11. The laser of claim 5 wherein the first optical coupler comprises an output configured for attachment to an interferometer.

12. The laser of claim 5 wherein the tunable filter comprises;
   an input ferrule having a partially reflecting surface and an output ferrule having a partially reflecting surface,
   wherein the input ferrule and output ferrule define an optical cavity.

13. The laser of claim 12 wherein at least one of the input ferrule and the output ferrule are movable with respect to each other, whereby a size of the optical cavity is changed.

14. The laser of claim 13 wherein the size of the optical cavity is changed in response to a control signal from a controller.

15. The laser of claim 14 wherein the controller changes the size of the optical cavity at a predefined rate.

16. The laser of claim 15 wherein the predetermined rate is selected to produce a Doppler shift in in light passing through the cavity.

17. The laser of claim 16 wherein the Doppler shift ranges from about 0 to about +23 MHz.

18. The laser of claim 16 wherein the Doppler shift ranges from −23 MHz to about 0.

19. A dispersion compensation module comprising:
   a first chirped fiber Bragg grating having a first input;
   a second chirped fiber Bragg grating having a second input; and
   a four port circulator, wherein a first port is an input port, a second port is an output port, a third port is in optical communication with the first input, and a fourth port is in optical communication with the second input.

20. The dispersion compensation module of claim 19, wherein the first port of the four port circulator is configured to attach to a tunable optical filter, the tunable optical filter being tunable by a control system.

21. The dispersion compensation module of claim 19, wherein the second port of the four port circulator is configured to attach to an interferometer.

\* \* \* \* \*